(12) United States Patent
Nakamata et al.

(10) Patent No.: US 6,570,323 B1
(45) Date of Patent: May 27, 2003

(54) ORGANIC THIN-FILM LIGHT-EMITTING DEVICE

(75) Inventors: Yuko Nakamata, Kanagawa (JP); Yutaka Terao, Kanagawa (JP)

(73) Assignee: Fuji Electric Co., Ltd., Kawasaki (JP)

(*) Notice: Subject to any disclaimer, the term of this patent is extended or adjusted under 35 U.S.C. 154(b) by 0 days.

(21) Appl. No.: 09/506,097

(22) Filed: Feb. 17, 2000

(30) Foreign Application Priority Data

Feb. 23, 1999 (JP) ............................................ 11-045517

(51) Int. Cl.⁷ ................................................ H01J 63/04
(52) U.S. Cl. ........................ 313/500; 313/504; 313/505; 313/506
(58) Field of Search ................................. 313/498, 504, 313/500, 505, 506

(56) References Cited

U.S. PATENT DOCUMENTS 5,701,055 A   12/1997  Nagayama et al. ......... 313/504
6,037,712 A  * 5/2000  Codama et al.

FOREIGN PATENT DOCUMENTS

JP          8-315981        11/1996
JP          9-102393        4/1997

* cited by examiner

Primary Examiner—Sandra O'Shea
Assistant Examiner—Guiyoung Lee
(74) Attorney, Agent, or Firm—Kanesaka & Takeuchi

(57) ABSTRACT

The organic thin-film light-emitting device includes a substrate, a plurality of first electrodes arranged parallel on the substrate, an electroluminescent layer made of an organic material and formed on the first electrodes, a plurality of second electrodes formed on the electroluminescent layer, and an electrically insulating barrier wall. The barrier wall includes barrier wall lines disposed at gaps in an electrode pattern of the second electrodes, and barrier wall end lines connected to the barrier wall lines so that the barrier wall lines do not have ant free ends. Thus, peeling-off of the barrier wall lines as a shadow mask at their end is prevented.

5 Claims, 3 Drawing Sheets

ORGANIC THIN-FILM LIGHT-EMITTING DEVICE

BACKGROUND OF THE INVENTION AND RELATED ART STATEMENT

The present invention relates to an organic thin-film light-emitting device for use in, for example, a flat-panel display. More specifically, the invention is directed to a structure of an organic thin-film light-emitting device for preventing electrical contact between upper electrodes in manufacturing the device and thus, resulting in high productivity.

An organic thin-film light-emitting device is also called an organic thin-film electroluminescent (hereinafter abbreviated to EL) device. The EL device emits light by recombination of an electron and a hole, which are injected to an organic thin-film by applying an electric field. The organic thin-film generally formed of multiple layers.

FIG. 3(a) and FIG. 3(b) show a conventional organic thin-film light-emitting device. FIG. 3(a) is a sectional view of a two-layered type light-emitting device, and FIG. 3(b) is a sectional view of a three-layered type. The organic thin-film light-emitting device shown in FIG. 3(a) is a two-layered type, and is constructed by sequentially forming an anode 2 which is a transparent electrode of ITO (indium tin oxide) deposited on a transparent substrate 1, an organic EL medium layer 4 formed of a hole transport layer 4a and a light-emitting layer 4b, and a cathode 5 which is a metal electrode (Appl. Phys. Lett. vol. 51, p. 913, 1987). The organic thin-film light-emitting device shown in FIG. 3(b) is a three-layered type, and further comprises an electron transport layer 4c formed between the cathode 5 and the light-emitting layer 4b. Recently, also known is a four-layered structure in which a hole injection layer is further formed between the anode 2 and the hole transport layer 4a (e.g. SID 97 DIGEST, p. 1073, 1997).

FIG. 4 is a perspective view of a conventional organic thin-film light-emitting device.

The organic thin-film light-emitting device is a so-called X, Y matrix type (simple matrix type). The device is fabricated by laminating sequentially on a transparent glass substrate 1, an anode 2 formed of a multiple of transparent electrodes made of, e.g. ITO, an electrically insulating layer 7, an organic EL medium layer 4, a metal cathode 5 which constitutes upper electrodes orthogonal to the transparent electrodes. A light-emitting area of the organic thin-film light-emitting device is composed of an organic EL medium layer 4, and a pair of anode 2 and metal cathode 5 which oppose each other and sandwich the organic EL medium layer. One pixel is formed, as one unit, of a light-emitting area formed by an overlap of a single electrode composing the transparent anode 2 and a single electrode composing the metal cathode 5 orthogonally disposed each other. A flat panel display device comprises a plurality of the light-emitting areas corresponding to the pixels, which are arranged on the substrate. A flat panel display device is operated by driving the transparent anodes 2 and the metal cathodes 5, to which lead wires (not shown) are attached around the flat panel.

Generally, patterning of the anodes 2 is performed by photolithography after forming a film of an anode material on a substrate. Namely, at first, photoresist is coated on an anode film; then, patterning of the photoresist is performed to a designed configuration by exposure and development; and finally, the anode material is etched and the photoresist is peeled off.

On the other hand, the upper electrodes are very difficult to be patterned by photolithography because the organic EL media for constituting an organic EL medium layer, such as a charge injection layer and a light-emitting layer, have a poor resistance to heat, solvent, or moisture. Japanese Unexamined Patent Publication (KOKAI) No. H9-320758 discloses a patterning method using a mask for vapor deposition. However, it causes poor adhesion between a substrate and a mask, resulting in a blur due to migration of an evaporating material to a clearance at the poor adhesion portion. In addition, if a fine pattern is formed by the mask, an accurate pattern can not be formed because of the problems, such as deflection of the mask, due to insufficient strength of the mask.

A laser processing using excimer laser or YAG laser is considered (Japanese Unexamined Patent Publication (KOKAI) No. H9-50888). However, this method causes poor productivity due to a difference of workability between places with or without the organic material film beneath the cathode film. The laser processing also causes a short-circuiting of an anode with a cathode due to formation of burrs around the cathode line edges by the laser processing. Further, an organic material layer around the laser-irradiated portion suffers from a damage due to laser light.

To solve this problem, a so-called shadow mask method is disclosed in Japanese Unexamined Patent Publication (KOKAI) No. H5-275172 (corresponding to U.S. Pat. No. 5,276,380). In this method, barrier walls in a stripe shape with a height of several to several tens $\mu$m are formed parallel to each other on the ITO-patterned substrate. Patterning of a cathode or an organic EL medium is performed by evaporating a material for the cathode or the organic EL medium from the direction perpendicular to the barrier walls or oblique to the substrate surface.

Japanese Unexamined Patent Publication (KOKAI) No. H8-315981 discloses another method, in which a series of electrically insulating barrier walls is formed on a surface of a substrate bearing ITO lines. The lines of the barrier walls are orthogonal to the ITO lines. The barrier wall has on its top an overhanging portion protruding in the direction parallel to the substrate surface, i.e. the barrier wall has an inversely tapered cross section. After the formation of the barrier walls, an organic EL medium layer and a cathode are formed in this order. Each electrode of the cathode is separated by the overhangs of the barrier walls and the electrodes at both sides of the barrier wall are electrically insulated from each other. In this method, short-circuiting of an anode of ITO and a cathode is prevented by means where organic EL medium vapor flows around under the overhang of the barrier wall in a process of a light-emission layer formation, and in the following cathode formation, metal vapor flows around under the overhang of the barrier wall less than the flow of the organic EL medium vapor. Also disclosed is an insulation film disposed beneath the barrier wall, so that short-circuiting of an anode and a cathode, specifically short-circuiting at a cathode edge, is avoided.

The above-cited method performs fine processing of the cathode and the organic EL layer. However, if a photoresist for lift-off is used in the reverse-tapered barrier wall, the barrier wall is liable to peel-off, which causes short-circuiting between the adjacent upper electrodes and results in unsatisfactory patterning of the upper electrodes.

The present invention has been made in view of the above, and an object of the invention is to provide an organic thin-film light-emitting device comprising barrier walls as a shadow mask, in which peeling-off of the walls at their ends is prevented by a structure without free ends, and upper electrodes with any desired pattern can be reliably fabricated.

SUMMARY OF THE INVENTION

In order to attain the object, the invention provides an organic thin-film light-emitting device having an image display array formed of a plurality of light-emitting areas. The organic thin-film light-emitting device comprises a substrate, a plurality of first electrodes arranged parallel on the substrate, an EL layer of an organic material formed on an electrode pattern of the first electrodes, a plurality of second electrodes formed on the EL layer, and an electrically insulating barrier wall arrangement including a barrier wall line portion and barrier wall end portions. The barrier wall line portion includes a plurality of barrier wall lines disposed at gaps in an electrode pattern of the second electrodes, and the ends of the barrier wall lines are connected to the barrier wall end portions. No free end is left in the barrier wall lines.

Advantageously, the barrier wall arrangement comprises an insulating film and a photoresist for lift-off formed on the insulating film.

Advantageously, the width of the barrier wall end portion is wider than the width of the gap in the electrode pattern of the second electrodes and wide enough to prevent peeling-off of the barrier wall lines at their ends.

BRIEF DESCRIPTION OF THE DRAWINGS

FIGS. 1(a) and 1(b) show an organic thin-film light-emitting device of the invention, wherein FIG. 1(a) is a plan view, and FIG. 1(b) is a sectional view taken along line 1(b)–1(b) in FIG. 1(a);

FIGS. 2(a)–2(c) show a process for fabricating an organic thin-film light-emitting device of the invention, wherein FIG. 2(a) is a partial sectional view illustrating an insulating film, FIG. 2(b) is a partial sectional view illustrating the insulating film and a photoresist, and FIG. 2(c) is a partial sectional view illustrating the barrier walls;

FIGS. 3(a) and 3(b) show a conventional organic thin-film light-emitting device, wherein FIG. 3(a) is a sectional view of a two-layered type light-emitting device, and FIG. 3(b) is a sectional view of a three-layered type.

DETAILED DESCRIPTION OF PREFERRED EMBODIMENTS

The present invention will be explained hereinafter with reference to the accompanying drawings.

Figure 1A:
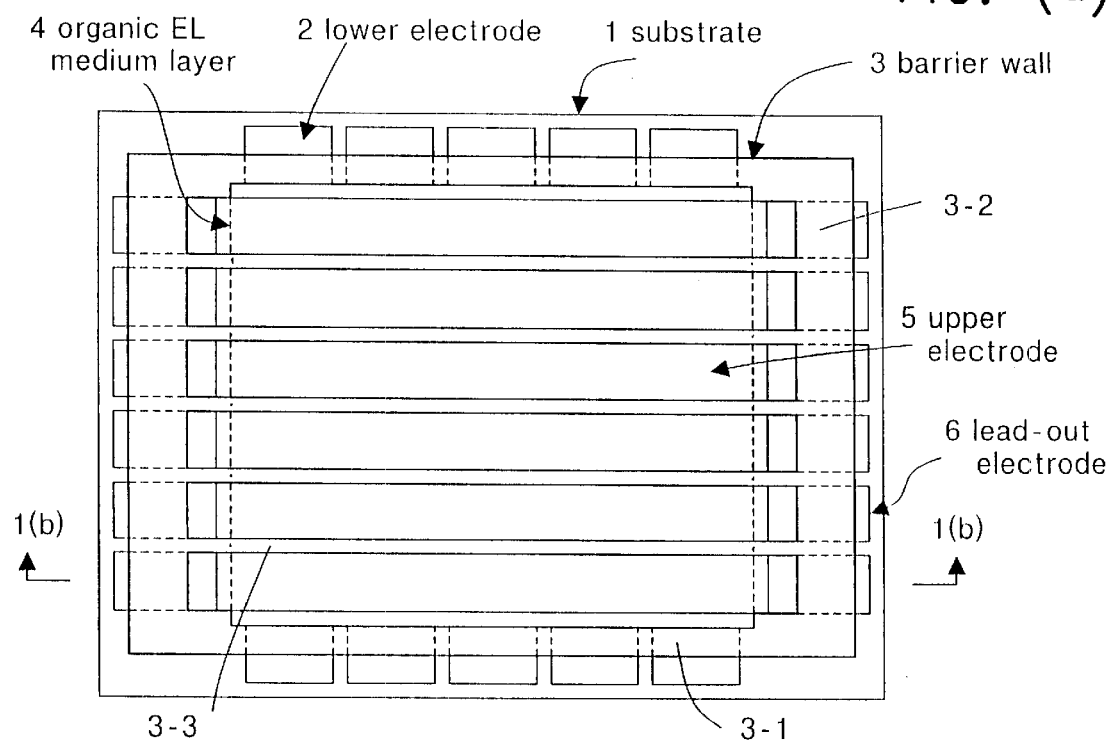
Figure 1B:
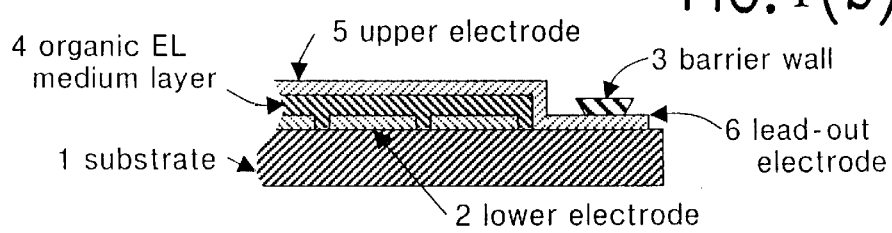

FIG. 1(a) and FIG. 1(b) show an organic thin-film light-emitting device as an embodiment of the invention. FIG. 1(a) is a perspective view of the device, and FIG. 1(b) is a sectional view taken along line 1(b)–1(b) in FIG. 1(a). A plurality of lower electrodes (first electrodes) 2 made of, for example, ITO is arranged in a stripe shape on a substrate 1. An organic EL medium layer 4 is laminated on the lower electrodes. A plurality of upper electrodes (second electrodes) 5 is laminated in a stripe shape on the organic EL medium layer 4. The upper electrodes are disposed orthogonally to the lower electrodes. Each of the upper electrodes 5 is connected to each of lead-out electrodes 6 having the same width as the upper electrode. An electrically insulating barrier wall arrangement 3 includes barrier wall end portions or lines 3-1 formed on the end portions of the lower electrodes 2, and end portions or lines 3-2 on the lead-out electrodes 6. Barrier wall line portions or lines 3-3 of the barrier wall arrangement 3 are formed at respective gaps between the upper electrodes 5 and connected to the end portions 3-2.

The organic EL medium layer 4 may be either a single light-emitting layer, a two-layer structure formed of a hole transport layer and a light-emitting layer, or a three-layer structure formed of a hole transport layer, a light-emitting layer and an electron transport layer. Light-emitting areas are portions of the organic EL medium layer sandwiched by the lines of the lower electrodes 2 and the lines of the upper electrodes 5 orthogonal to the lines of the lower electrodes.

The substrate 1 may be made of a plate of quarts or glass, or a transparent plastic plate of, such as polyester, polymethacrylate, polycarbonate or polysulfone. Alternatively, a metal sheet, metal foil or a plastic film may be used.

In the organic thin-film light-emitting device of the invention, the lower electrodes 2 perform as anodes for injecting holes. The anode may be made of indium zinc oxide ($In_2O_3+ZnO$) as well as the above mentioned ITO (indium tin oxide: $In_2O_3+SnO_2$). In addition, a laminate of one of these transparent conductive films and a metal film may be used.

Although the substrate 1 and the lower electrodes 2 are transparent and light is emitted through the substrate in the above described organic thin-film light-emitting device, the upper electrodes may be made of transparent electrodes and light can be taken out through the upper electrodes. In the latter case, advantageously, the lower electrodes are made of metal, or a light reflection film is formed on the substrate surface opposite to the film-laminated surface. The structure enables to take out light more efficiently.

A process for fabricating the organic thin-film light-emitting device of the invention is described below.

Figure 2A:
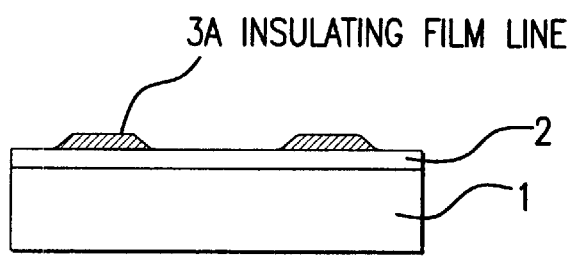
Figure 2B:
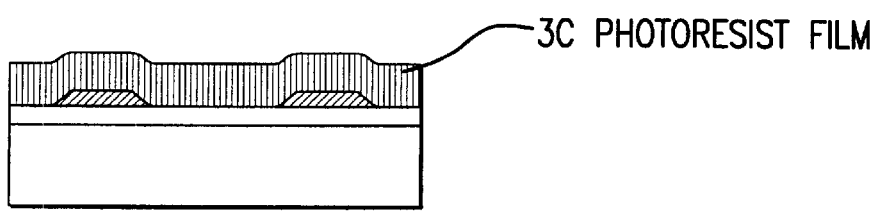
Figure 2C:
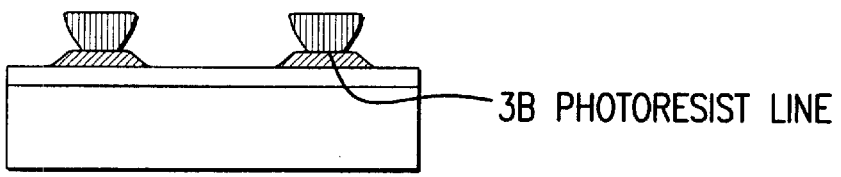
Figure 3A:
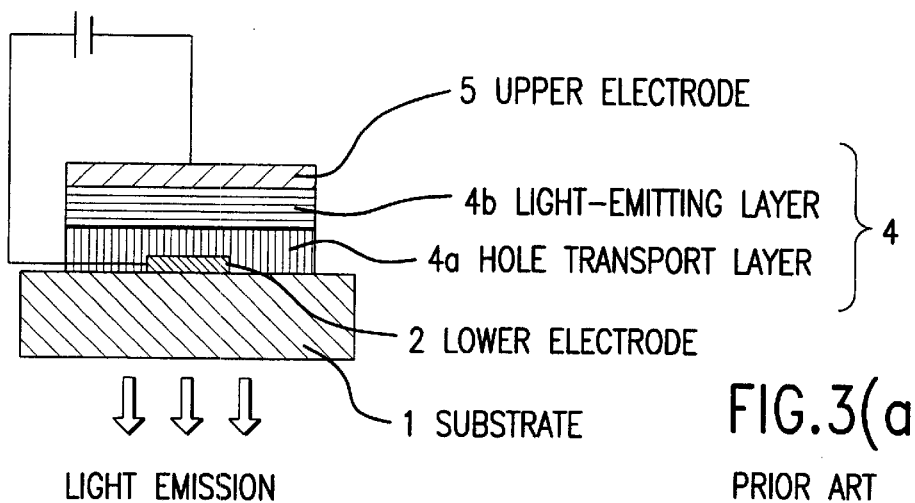
Figure 3B:
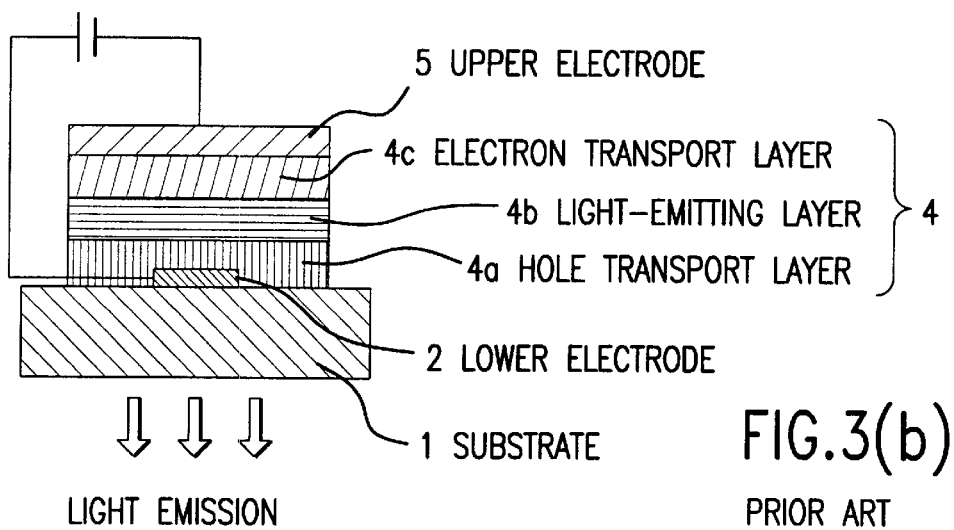
Figure 4:
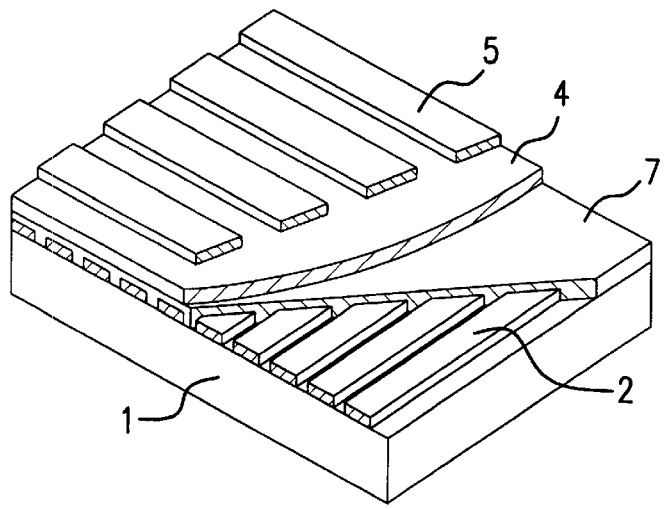
FIG. 4 is a perspective view of a conventional organic thin-film light-emitting device.

FIG. 2(a), FIG. 2(b) and FIG. 2(c) show a process for forming an organic thin-film light-emitting device of the invention. FIG. 2(a) is a partial sectional view illustrating the insulating film, FIG. 2(b) is a partial sectional view illustrating the insulating film and a photoresist film, and FIG. 2(c) is a partial sectional view illustrating the barrier walls.

An ITO film was formed on a transparent substrate of glass by a sputtering method followed by shaping to strips by means of photolithography to obtain lines of the transparent lower electrodes 2. The lower electrodes were formed such that each electrode had a film thickness of 100 nm and a line width of 90 μm, and each gap between adjacent electrodes was 20 μm. Each line edge of the lower electrode was formed to be tapered. An insulating film of $Si_3N_4$ or $SiO_2$ of about 300 nm thick was formed by means of sputtering or PECVD on the substrate patterned with the lower electrode strips of ITO. A film of a positive-type photoresist was formed on the insulating film followed by patterning of the photoresist film. Then, lines of an insulating film 3A (FIG. 2(a)) were formed by patterning the insulating film by means of anisotropic etching, such as dry etching.

After that, a photoresist film 3C (FIG. 2(b)) from 4 to 5 μm thick was formed by using a photoresist for lift-off, available under the trade name ZPN1100 from Nippon Zeon Co., Ltd. Then, the photoresist film was exposed and developed so that photoresist lines 3B having an overhanging cross section were formed to overlay the insulating film lines 3A. The insulating film line 3A and the photoresist line 3B constitute the line portion 3-3 of an electrically insulating barrier wall or barrier wall arrangement 3 (FIG. 2(c)). The line portions of the electrically insulating barrier wall 3 did not have its free end. Although ZPN1100 was used as the photoresist for lift-off in the above described photoresist line 3B, positive-type photoresist SIPR-9691 from Shinetsu Chemical Industries Co., Ltd. may also be used. Barrier wall end portions of the barrier wall arrangement were formed on the lead-out electrodes 6 leaving a part of an inside area for leading the upper electrodes 5. The width of the barrier wall end portion of the barrier wall arrangement was wider than the width of the gap (several tens of microns) between the upper electrodes in order to provide enough overlapping area with the lead-out electrodes 6.

An organic EL medium layer was formed by evaporating an organic EL medium material such that any part of the lower electrodes did not expose in pixel portions on the substrate. The organic EL medium layer was formed by first depositing an organic hole transport layer 4a of N,N'-diphenyl-N,N'-bis(3 methylphenyl)-1,1'-biphenyl-4,4'-diamine (TPD), then depositing a light-emitting layer 4b of tris(8-quinolinol) aluminum ($Alq_3$). The both layers had about 50 nm thick. As the upper electrodes 5, a film of Al—Li alloy was formed with a film thickness of about 100 nm.

According to the present invention, an organic thin-film light-emitting device having an image display array of a plurality of light-emitting areas comprises a substrate, a plurality of first electrodes arranged parallel on the substrate, an EL layer of an organic material formed on an electrode pattern of the first electrodes, a plurality of second electrodes arranged on the EL layer, and an electrically insulating barrier wall arrangement, wherein the barrier wall arrangement includes barrier wall lines disposed at gaps in the second electrode pattern and barrier wall end portions which connect the ends of the barrier wall lines. Because the barrier wall lines of the barrier wall arrangement are mechanically reinforced by the barrier wall end portions, the barrier wall lines are prevented from being peeled-off, and short-circuiting between adjacent upper electrodes is avoided. Thus, the organic thin-film light-emitting device with excellent productivity is obtained.

While the invention is explained with reference to the specific embodiments of the invention, the explanation is illustrative and the invention is limited only by the appended claims.

What is claimed is:
1. An organic thin-film light-emitting device having an image display array of a plurality of light emitting areas, comprising;
   a substrate;
   a plurality of first electrodes arranged parallel on the substrate;
   an electroluminescent layer made of an organic material and formed on the first electrodes;
   a plurality of second electrodes formed on the electroluminescent layer to form gaps between the second electrodes;
   lead-out electrodes connected to the second electrodes and disposed on the substrate; and
   an electrically insulating barrier wall including barrier wall lines with ends, each barrier wall line being formed of an insulating film and photoresist for lift-off formed on the insulating film in an overhanging shape and disposed in each of the gaps between the second electrodes, and barrier wall end lines connecting the barrier wall lines and being disposed on the lead-out electrodes so that the ends of the barrier wall lines are not exposed.

2. An organic thin-film light-emitting device according to claim 1, wherein said barrier wall end line has a width wider than that of the gap in the second electrodes so that the barrier wall lines do not peel-off at the ends thereof.

3. An organic thin-film light-emitting device according to claim 2, wherein said photoresist of the barrier wall line has a tapered shape tapering toward the insulating film, and the insulating film has a tapered shape tapering toward the photoresist.

4. An organic thin-film light-emitting device having an image display array of a plurality of light emitting areas, comprising:
   a substrate;
   a plurality of first electrodes arranged parallel on the substrate;
   an electroluminescent layer made of an organic material and formed on the first electrodes;
   a plurality of second electrodes formed on the electroluminescent layer to form gaps between the second electrodes;
   lead-out electrodes connected to the second electrodes and disposed on the substrate; and
   an electrically insulating barrier wall including barrier wall lines with ends, each barrier wall line being formed of an insulating film and photoresist for lift-off formed on the insulating film in an overhanging shape and disposed in each of the gaps between the second electrodes, said photoresist of the barrier wall line having a tapered shape tapering toward the insulating film and the insulating film having a tapered shape tapering toward the photoresist, and barrier wall end lines connecting the barrier wall lines and disposed on the lead-out electrodes so that the ends of the barrier wall lines are not exposed, each of said barrier wall end lines having a width wider than that of the gap in the second electrodes so that the barrier wall end lines do not peel-off at the ends thereof.

5. An organic thin-film light-emitting device according to claim 4, wherein said barrier wall further includes end portions disposed on the first electrodes to thereby entirely surround pixels of the light-emitting device by the end portions and the end lines.

\* \* \* \* \*